(12) United States Patent
Towle et al.

(10) Patent No.: US 7,071,024 B2
(45) Date of Patent: Jul. 4, 2006

(54) METHOD FOR PACKAGING A MICROELECTRONIC DEVICE USING ON-DIE BOND PAD EXPANSION

(75) Inventors: Steven Towle, Phoenix, AZ (US); Martha Jones, Portland, OR (US); Quat T. Vu, Santa Clara, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/861,689

(22) Filed: May 21, 2001

(65) Prior Publication Data

US 2002/0173133 A1   Nov. 21, 2002

(51) Int. Cl.
  *H01L 21/44* (2006.01)
(52) U.S. Cl. ..................... 438/106; 257/737
(58) Field of Classification Search ........ 438/106–109, 438/118, 125, 612–614, 617, 622, 627; 257/673, 257/693, 737–738, 750–751
  See application file for complete search history.

(56) References Cited

U.S. PATENT DOCUMENTS

| | | | |
|---|---|---|---|
| 5,048,179 A | 9/1991 | Shindo et al. .................. 29/840 |
| 5,055,532 A | 10/1991 | Hoffman et al. ............. 525/528 |
| 5,105,257 A | 4/1992 | Michii ......................... 357/70 |
| 5,346,858 A * | 9/1994 | Thomas et al. ............. 438/669 |
| 5,353,498 A | 10/1994 | Fillion et al. ................. 29/840 |
| 5,355,283 A | 10/1994 | Marrs et al. ................. 361/760 |
| 5,422,513 A | 6/1995 | Marcinkiewicz et al. ... 257/668 |
| 5,424,250 A | 6/1995 | Swada ......................... 438/127 |
| 5,497,033 A | 3/1996 | Fillion et al. ................ 257/723 |
| 5,503,286 A * | 4/1996 | Nye et al. ...................... 216/13 |
| 5,508,229 A * | 4/1996 | Baker .......................... 438/614 |
| 5,523,622 A | 6/1996 | Harada et al. .............. 257/734 |
| 5,527,741 A | 6/1996 | Cole et al. .................. 437/209 |
| 5,608,262 A | 3/1997 | Degani et al. .............. 257/723 |
| 5,701,032 A | 12/1997 | Fischer et al. .............. 257/692 |
| 5,703,400 A * | 12/1997 | Wojnarowski et al. ...... 257/723 |
| 5,707,894 A | 1/1998 | Hsiao ........................ 437/209 |
| 5,745,984 A | 5/1998 | Cole, Jr. et al. .............. 29/834 |
| 5,798,567 A | 8/1998 | Kelly et al. .................. 257/723 |
| 5,844,317 A | 12/1998 | Bertolet et al. ............. 257/773 |
| 5,864,470 A | 1/1999 | Shim et al. ................. 361/777 |
| 5,870,822 A * | 2/1999 | Drake et al. .................. 29/840 |
| 5,892,287 A * | 4/1999 | Hoffman et al. ............ 257/777 |

(Continued)

FOREIGN PATENT DOCUMENTS

EP         0149317         7/1985

(Continued)

OTHER PUBLICATIONS

S.Wolf et al. (Silicon Processing for the VLSI Era; vol. 1—Process Technology, Prologue, p. xxiii).*

(Continued)

*Primary Examiner*—David Vu
(74) *Attorney, Agent, or Firm*—Schwegman, Lundberg, Woessner & Kluth, P.A.

(57) ABSTRACT

Expanded bond pads are formed over a passivation layer on a semiconductor wafer before the wafer is diced into individual circuit chips. After dicing, the individual chips are packaged by fixing each chip within a package core and building up one or more metallization layers on the resulting assembly. In at least one embodiment, a high melting temperature (lead free) alternative bump metallurgy (ABM) form of controlled collapse chip connect (C4) processing is used to form relatively wide conducting platforms over the bond pads on the wafer.

27 Claims, 11 Drawing Sheets

U.S. PATENT DOCUMENTS

| | | | |
|---|---|---|---|
| 5,904,955 A | 5/1999 | Goldstein et al. | |
| 5,960,308 A * | 9/1999 | Akagawa et al. | 438/613 |
| 6,002,163 A | 12/1999 | Wojnarowski | 257/620 |
| 6,014,317 A | 1/2000 | Sylvester | 361/760 |
| 6,025,275 A * | 2/2000 | Efland et al. | 438/722 |
| 6,049,465 A | 4/2000 | Blish, II et al. | 361/767 |
| 6,060,777 A | 5/2000 | Jamieson et al. | 257/707 |
| 6,084,297 A | 7/2000 | Brooks et al. | 257/698 |
| 6,084,777 A | 7/2000 | Kalidas et al. | 361/707 |
| 6,130,478 A | 10/2000 | Dumoulin et al. | 257/728 |
| 6,153,448 A | 11/2000 | Takahashi et al. | 438/114 |
| 6,154,366 A * | 11/2000 | Ma et al. | 361/704 |
| 6,162,652 A | 12/2000 | Dass et al. | 438/18 |
| 6,222,246 B1 | 4/2001 | Mak et al. | 257/532 |
| 6,239,482 B1 | 5/2001 | Fillion et al. | 257/678 |
| 6,242,282 B1 * | 6/2001 | Fillion et al. | 438/106 |
| 6,255,737 B1 | 7/2001 | Hashimoto | 257/784 |
| 6,262,579 B1 * | 7/2001 | Chazan et al. | 324/537 |
| 6,271,469 B1 * | 8/2001 | Ma et al. | 174/52.4 |
| 6,277,669 B1 | 8/2001 | Kung et al. | 438/106 |
| 6,281,046 B1 | 8/2001 | Lam | 438/113 |
| 6,287,893 B1 * | 9/2001 | Elenius et al. | 438/108 |
| 6,309,912 B1 * | 10/2001 | Chiou et al. | 438/118 |
| 6,316,830 B1 * | 11/2001 | Lin | 257/737 |
| 6,326,701 B1 * | 12/2001 | Shinogi et al. | 257/620 |
| 6,361,959 B1 * | 3/2002 | Beroz et al. | 435/14 |
| 6,388,333 B1 | 5/2002 | Taniguchi et al. | 257/777 |
| 6,590,291 B1 | 7/2003 | Akagawa | 257/774 |
| 6,621,155 B1 | 9/2003 | Perino et al. | 257/686 |
| 6,894,399 B1 | 5/2005 | Vu et al. | |
| 2001/0013654 A1 | 8/2001 | Kalidas et al. | 257/738 |
| 2002/0008314 A1 | 1/2002 | Takeuchi | 257/697 |
| 2002/0070443 A1 | 6/2002 | Mu et al. | 257/712 |
| 2002/0158334 A1 * | 10/2002 | Vu et al. | 257/723 |

FOREIGN PATENT DOCUMENTS

| | | |
|---|---|---|
| EP | 0361825 | 4/1990 |
| EP | 0431205 | 6/1991 |
| EP | 0476971 | 3/1992 |
| EP | 0611129 | 8/1994 |
| EP | 0777274 | 6/1997 |
| EP | 0877419 | 11/1998 |
| EP | 1111662 | 6/2001 |
| GB | 2174543 | 11/1986 |
| JP | 62-004351 | 1/1987 |
| JP | 10-125721 | 5/1998 |
| JP | 11045955 | 2/1999 |
| JP | 11-204688 | 7/1999 |
| JP | 11312868 | 11/1999 |
| JP | 2000-243870 | 9/2000 |
| JP | 2000-307005 | 11/2000 |
| JP | 2000-349203 | 12/2000 |

OTHER PUBLICATIONS

Chen, Chang-Lee, et al., "Bond Wireless Multichip Packaging Technology for High Speed Circuits", *IEEE Transactions on Components, Hybrids, and Manufacturing Technology*, 15, NY, US,(1992),451-456.

Daum, W., et al., "Overlay High-Density Interconnect: A Chips-First Multichip Module Technology", *IEEE Computer Society*, 26, Long Beach, CA, US,(1993),23-29.

Gdula, Michael, et al., "An Overlay Interconnect Technology for 1GHz. and Above MCMs", *Proceedings of the Multi Chip Module Conference(MCMC)*, Santa Cruz, US,(1992),171-174.

* cited by examiner

METHOD FOR PACKAGING A MICROELECTRONIC DEVICE USING ON-DIE BOND PAD EXPANSION

FIELD OF THE INVENTION

The invention relates generally to microelectronic circuits and, more particularly, to structures and techniques for packaging such circuits.

BACKGROUND OF THE INVENTION

After a microelectronic circuit chip (i.e., a die) has been manufactured, the chip is typically packaged before it is sold to the public. The package provides both protection for the chip and a convenient and often standardized method for mounting the chip within an external system. The circuit package must include some means for providing electrical communication between the various terminals of the circuit chip and the exterior environment. Many different packaging technologies have been used in the past for providing this communication. The type of package that is used for a particular chip can have a significant impact on the performance of the completed device. Typically, in a high volume manufacturing environment, cost will be a primary concern in selecting a packaging technology. Performance is also a very important criterion. As circuits get smaller and faster, there is an ongoing need for innovative and cost effective packaging technologies.

DETAILED DESCRIPTION

In the following detailed description, reference is made to the accompanying drawings that show, by way of illustration, specific embodiments in which the invention may be practiced. These embodiments are described in sufficient detail to enable those skilled in the art to practice the invention. It is to be understood that the various embodiments of the invention, although different, are not necessarily mutually exclusive. For example, a particular feature, structure, or characteristic described herein in connection with one embodiment may be implemented within other embodiments without departing from the spirit and scope of the invention. In addition, it is to be understood that the location or arrangement of individual elements within each disclosed embodiment may be modified without departing from the spirit and scope of the invention. The following detailed description is, therefore, not to betaken in a limiting sense, and the scope of the present invention is defined only by the appended claims, appropriately interpreted, along with the full range of equivalents to which the claims are entitled. In the drawings, like numerals refer to the same or similar functionality throughout the several views.

The present invention relates to techniques and structures for packaging microelectronic circuits using a build up process on the surface of a microelectronic die. That is, one or more metallization layers are built up over the die as part of the packaging process to provide for electrical interconnection between the terminals of the die and the exterior environment (e.g., an exterior circuit board). During wafer-level processing, an umber of expanded bond pads are formed over a passivation layer on the surface of a semiconductor wafer. Each expanded bond pad is conductively coupled, through a corresponding opening in the passivation layer, to an associated bond pad on an upper metal layer of the wafer. In a preferred approach, the expanded bond pads are significantly larger (at least in the plane of the passivation layer) than the bond pads on the upper layer of the wafer. After the expanded bond pads have been formed, the wafer is diced into individual microelectronic die that need to be packaged.

In one packaging approach, each individual die is fixed within a package core to form a die/core assembly. One or more metallization layers are then built up over the die/core assembly. Because each expanded bond pad is larger than the associated bond pad below the passivation layer, a significant increase in the package to die via alignment budget is achieved. Because the expanded pads are deposited at the wafer level, rather than at the package level, wafer level processing and fab processing capabilities can betaken advantage of. It is believed that the use of such techniques can provide a significant cost benefit during the manufacturing process. The application of the expanded bond pads at the wafer processing level can also improve die sorting capabilities during manufacture as the surface area for sort probe contact is increased. The inventive techniques can be used in connection with a wide variety of microelectronic circuit types including, for example, digital data processing devices and logic circuits. The techniques are particularly advantageous when used in connection with multiple chip modules.

As is well known, semiconductor wafers are typically large disk like structures that can carry hundreds or even thousands of independent circuits. As used herein, the phrase "independent circuits" is used to refer to the individual circuits or systems on the wafer that will eventually be separated from one another during wafer dicing. During wafer-level processing, the wafer is processed in a known manner to develop a plurality of independent circuits (e.g., microprocessor circuits) distributed across an upper surface thereof. Each of the independent circuits on the wafer will usually include multiple layers of internal circuitry. Bond pads are formed on the top of the wafer to provide an electrical interface to the internal circuitry. After wafer processing is complete, the wafer is typically cut up into separate circuit chips or dice.

Figure 1:
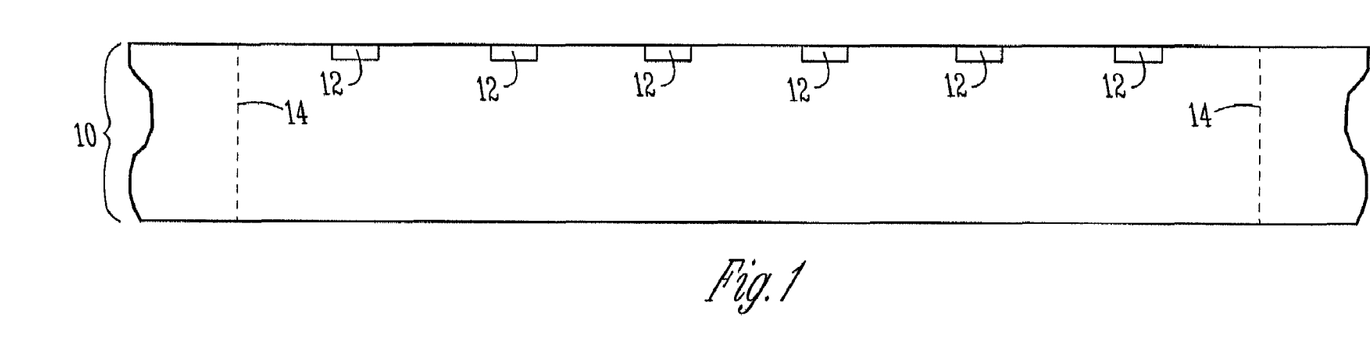
FIGS. 1 , 2, 3, 4, 5, 6, and 7 are a series of diagrams illustrating a method for fabricating a microelectronic die in accordance with one embodiment of the present invention.

FIGS. 1, 2, 3, 4, 5, 6, and 7 are a series of simplified diagrams illustrating a method for fabricating a microelectronic die in accordance with one embodiment of the present invention. FIG. 1 is across sectional side view illustrating a portion of a wafer 10 after circuitry and associated bond pads 12 have been formed thereon. For ease of illustration, the individual circuitry layers are not shown in the figures herein. Boundary lines 14 are shown in FIG. 1 to indicate where the wafer 10 will eventually be cut to form an individual die. Thus, the region of the wafer 10 between the two boundary lines 14 corresponds to a single independent circuit. In FIG. 1, six bond pads 12 are shown between the boundary lines 14. It should be appreciated, that the actual number of bond pads 12 used in a particular circuit will vary depending upon, for example, the complexity of the circuit. In one embodiment, the bond pads 12 on the wafer are relatively thin metal structures having thicknesses typically below 4 micrometers. The dimensions of these bond pads 12 are typically dictated by the minimum requirements for electrical test and assembly and the desire to minimize total area consumed to reduce die size (e.g., more dice per wafer).

Figure 2:
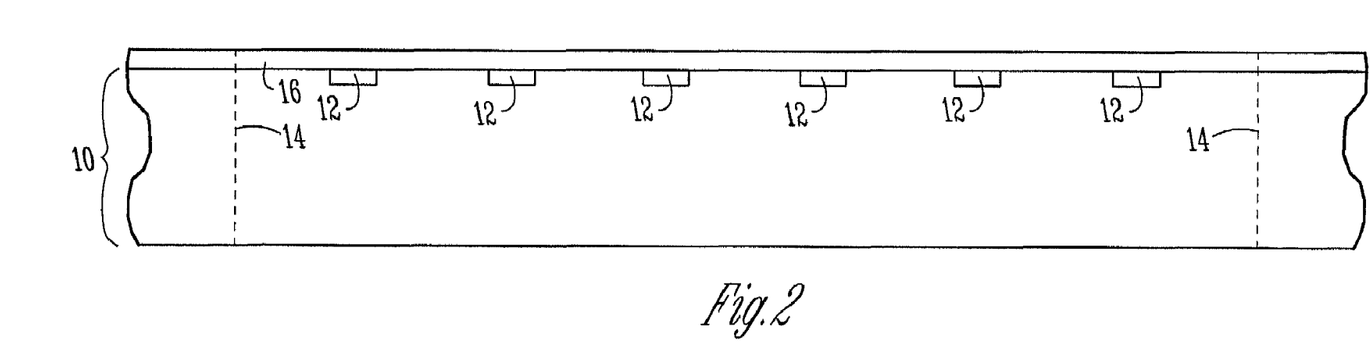
Figure 3:
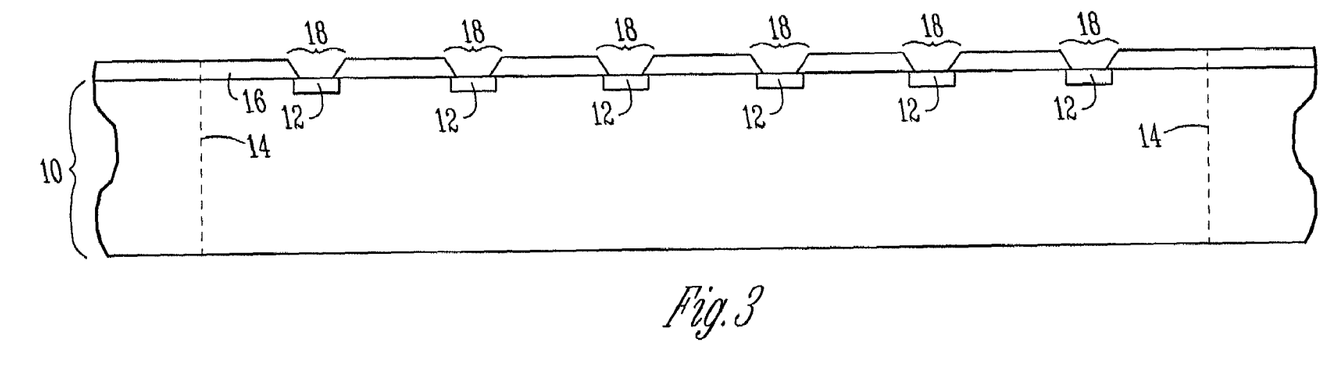

With reference to FIG. 2, a passivation layer 16 is next deposited on the upper surface of the wafer 10. Among other functions, the passivation layer 16 is used to protect the underlying circuitry from the surrounding environment. Typically, the passivation layer 16 will consist of a dielectric material such as, for example, silicon nitride. Other materials and/or combinations of materials are also possible. After the passivation layer 16 has been deposited, openings 18 are formed in the passivation layer 16 to expose at least part of the underlying bond pads 12, as illustrated in FIG. 3. In one approach, a mask (not shown) having the desired pattern of openings is first formed over the passivation layer 16 and the openings 18 are then etched using the mask. The mask material will then typically be removed. Other techniques for forming the openings 18 in the passivation layer 16 are also known. After the openings 18 have been formed, the completed passivation layer 16 will preferably overlap and cover the bond pad edges to provide a moisture barrier.

Figure 4:
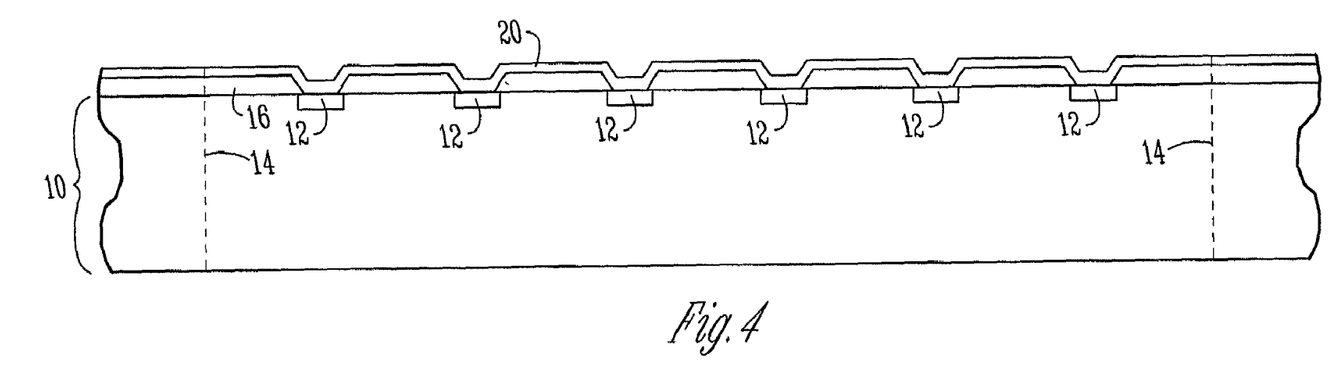
Figure 5:
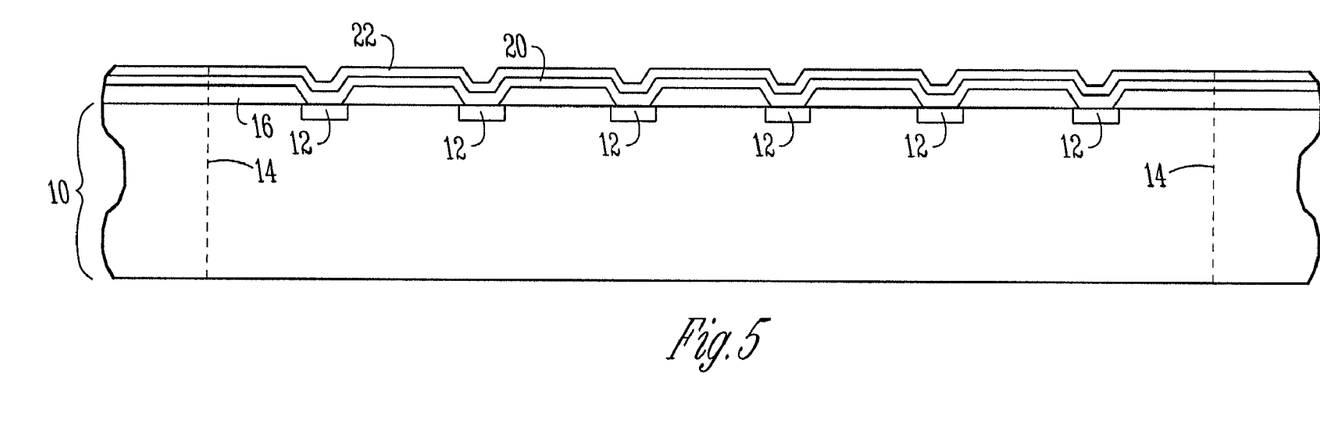

As illustrated in FIG. 4, an adhesion layer 20 is next deposited on the wafer 10. The adhesion layer 20 is operative for enhancing the adhesion of subsequently deposited metal to the passivation material. In a preferred embodiment, a layer of titanium is sputter deposited on the wafer 10 to form the adhesion layer 20. Other materials (e.g., chromium, tungsten, tantalum, tantalum nitride, etc.) or alloys and other deposition processes can alternatively be used. With reference to FIG. 5, an optional seed layer 22 is next deposited on the wafer 10 to form an electrical connection to the edge of the wafer 10. The seed layer 22 also provides a protective barrier for the adhesion layer 20 and the metal below. In a preferred approach, copper is sputter deposited on the wafer 10 to form the seed layer 22. In at least one embodiment, a single layer is provided that acts as both the adhesion layer 20 and the seed layer 22.

Figure 6:
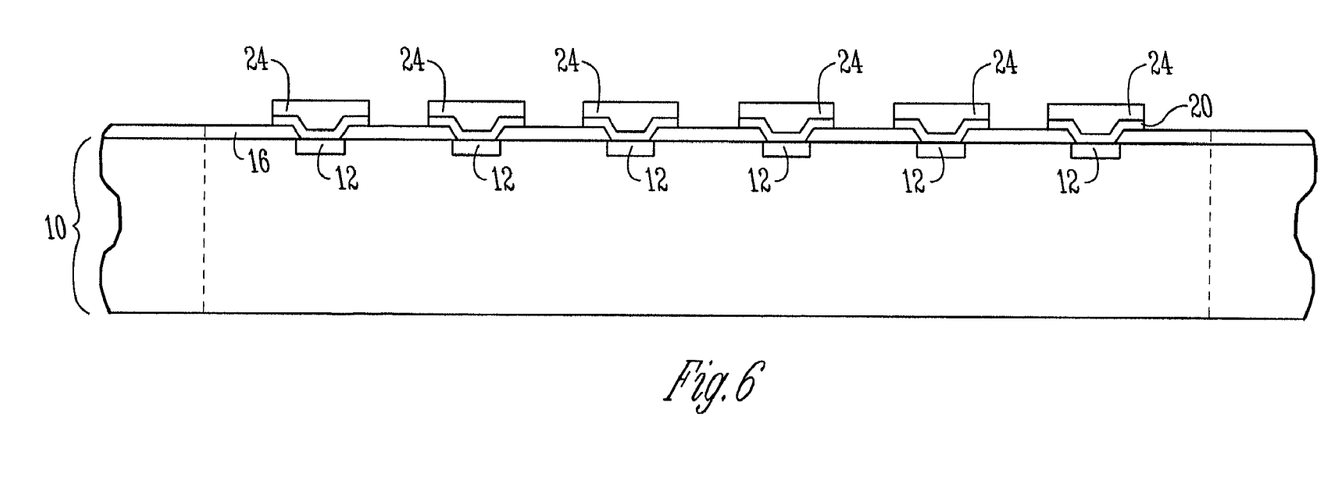

After the seed layer 22 has been applied, a number of expanded bond pads 24 are formed on the wafer 10, as shown in FIG. 6. The bond pad length, width, and pitch are defined by the lithographic or pattening processes used to produce the expanded bond pads, and are subject primarily to the limitations of these processes. The expanded bond pads 24 are preferably relatively thick structures (e.g., greater than 8 micrometers). They are therefore more compatible with the build up process tahn the relatively thin bond pads 12. Becouse the expanded bond pads 24 are deposited at the wafer level, wafer level processing and fab processing capabilities can be used to form the expanded bond pads 24. In a preferred approach, an alternative bump metallurgy (ABM) process is used to form the expanded bond pads 24. The process by which ABM is deposited on a wafer is analogous to that typically used in controlled collapse chip connect (C4) processing. However, ABM is lead-free and can withstand higher temperatures. while providing similar properties as C4 in this application (wafer level process that provides electrical connection over die bond pads for assembly, typically with a larger aspect ratio in length, width, and height relative to the original bond pad). In one embodiment, the ABM process is used to create relatively wide copper platforms above each of the bond pads 12 on the wafer 10.

The expanded bond pads 24 will preferably be significantly larger in size in at least one dimension (e.g., length and/or width in a plane defined by the passivation layer 16) than the bond pad openings 18 in the passivation layer 16. As will be described in greater detail, this increase in size will typically improve the alignment budget for the vias associated within the first build up layer by a significant amount. In the illustrated embodiment, the expanded bond pads 24 are approximately twice the width (i.e., the dimension across the page) of the associated bond pad openings 18. Although not shown, the expanded bond pads 24 are also approximately twice the length (i.e., the dimension into the page) of the associated bond pad openings 18. Bond pad expansion ratios of up to 40 are believed possible in accordance with the present invention. The expanded bond pads 24 can be the same shape as the bond pads 12 or a different shape. In one approach, the expanded bond pads 24 are made as large as is reliably possible within the capabilities of the particular on-wafer deposition process being used. The bond pad openings 18 can also be made smaller to increase the alignment budget between each bond pad 12 and its associated expanded pad 24. One or more expanded bond pads 24 can be formed that cover multiple underlying bond pads 12 as might be desired for certain circuit designs or due to limitations in the capability of other processing steps.

Figure 7:
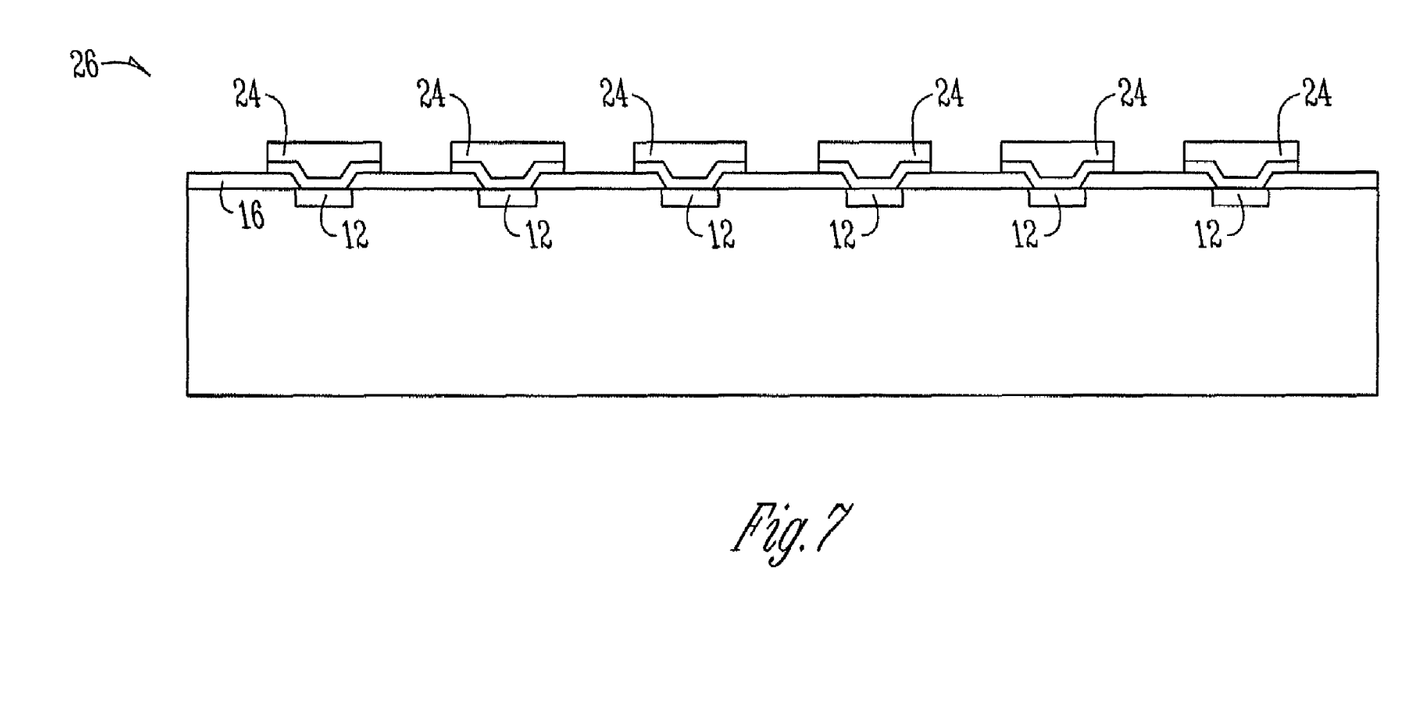

After the expanded bond pads 24 have been formed, the seed layer 22 is removed from the regions between the expanded pads 24, typically by etching. In addition, the adhesion layer 20 is removed from the regions between the expanded bond pads 24. The deposited pad material acts as a mask to protect the adhesion material beneath the expanded bond pads 24. Therefore, the adhesion material remains at the interface between each expanded pad 24 and the underlying bond pad 12 and passivation layer 16 to enhance adhesion therebetween. As shown in FIG. 7, the wafer 10 is eventually cut up to form individual microelectronic circuit dice 26. As is well known, in a typical manufacturing environment, chip sorting procedures arc performed before wafer dicing to group individual chips based on performance level and/or to determine whether each chip is functional. One advantage of depositing the expanded bond pads 24 during wafer level processing, therefore, is that they provide additional contact area for the probes that are used to test the individual die during sorting.

Figure 8:
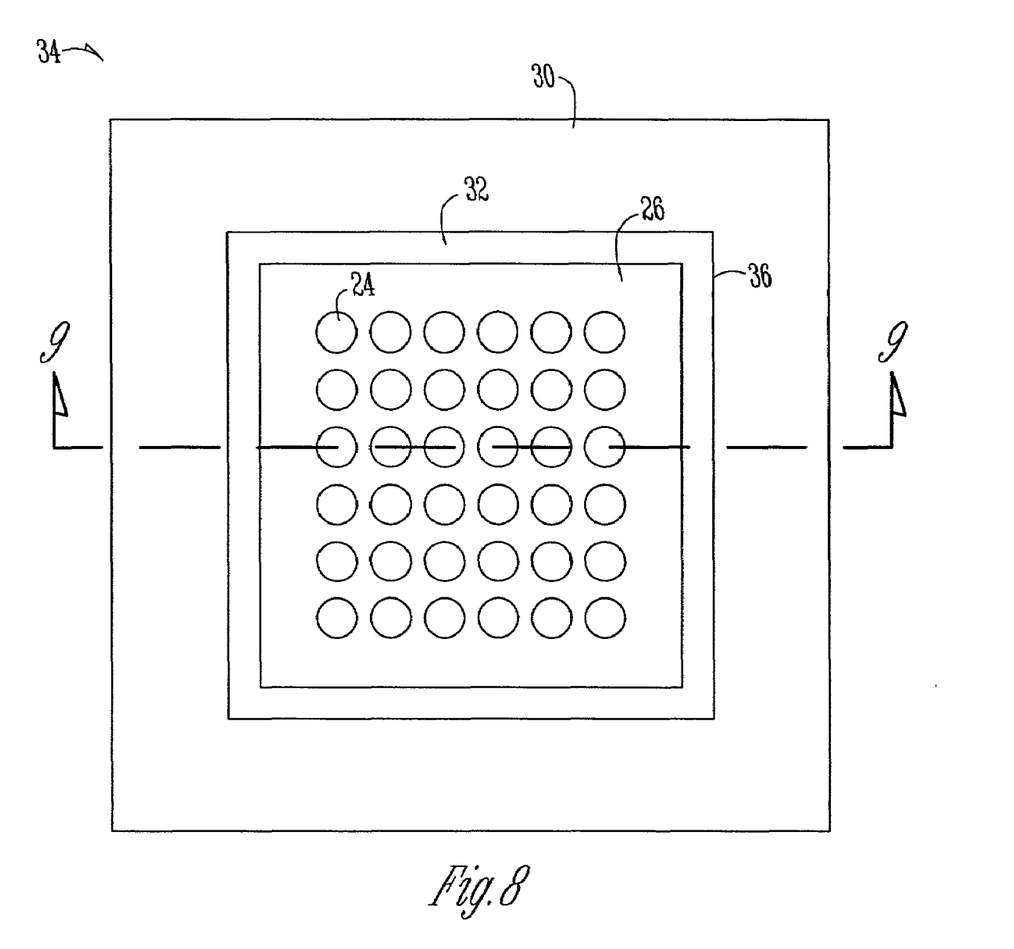
FIG. 8 is a simplified top view illustrating a die/core assembly in accordance with one embodiment of the present invention.

After the wafer has been diced, each individual die 26 is packaged. Often, a chip manufacturer will deliver the separated dice to a packaging vendor to perform the packaging. As described above, in a preferred approach, each individual die 26 is packaged by building up one or more metal layers on a surface of the die 26. The die 26 is first mounted within an opening in a package core to form a die/core assembly. Metal layers are then built up over the die core assembly to provide, among other things, conductive communication between the terminals of the die 26 and the leads or contacts of the package. FIG. 8 is a simplified top view illustrating a die/core assembly 34 in accordance with one embodiment of the present invention. As shown, the die 26 is fixed within an opening 36 in a package core 30 using an encapsulation material 32 (e.g., plastics, resins, epoxies, elastomers, and the like). The die 26 is first positioned within the opening 36 and the encapsulation material 32 is then flowed or injected into the gap between the die 26 and the core 30 and allowed to harden. The package core 30 can be formed from a wide variety of different materials. For example, the core material can include, bismaleimide triazine (BT), various resin-based materials, flame retarding glass/epoxy materials (e.g., FR4), polyimide-based materials, ceramic materials, metal materials (e.g., copper), and/or others.

Figure 9:
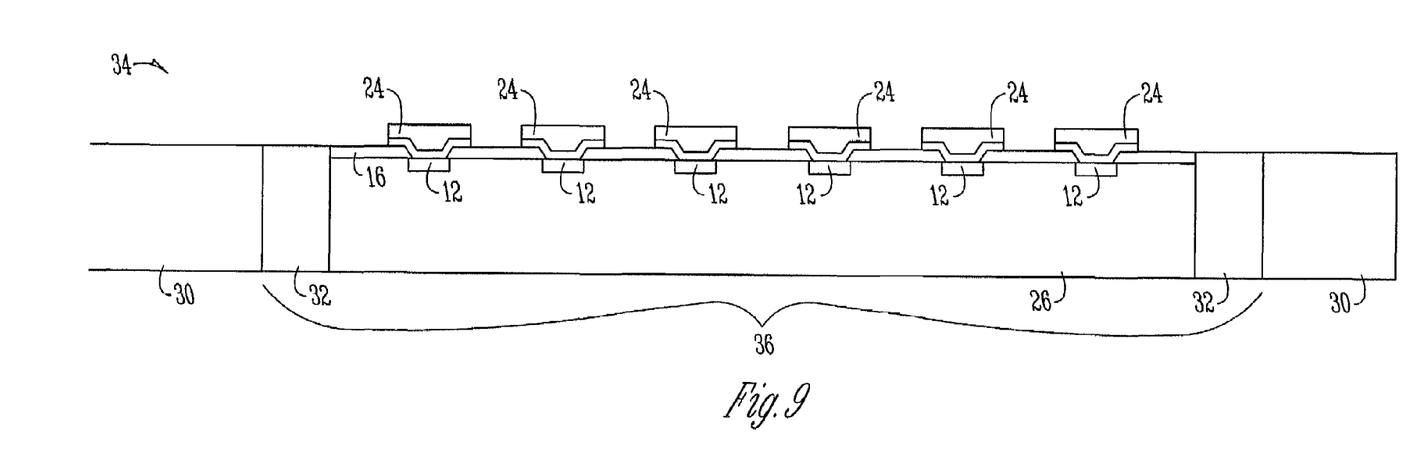
FIGS. 9, 10, 11, 12, and 13 are a series of diagrams illustrating a method for packaging a microelectronic die in accordance with one embodiment of the present invention.

FIGS. 9, 10, 11, 12, and 13 are a series of diagrams illustrating a method for packaging a die 26 in accordance with one embodiment of the present invention. FIG. 9 is a cross sectional side view of the die/core assembly 34 of FIG. 8. As shown, the die 26 is fixed within the opening 36 in the package core 30 with the upper surface of the passivation layer 16 of the die 26 substantially flush with the upper surface of the package core 30 (and with the upper surface of the encapsulation material 32). Other configurations for fixing the die 26 within the core 30 are also possible (e.g., the upper surface of the passivation layer 16 can be raised with respect to the upper surface of the core 30, etc.). The opening 36 can extend fully through the package core 30 (as shown in FIG. 9) or a full or partial floor portion can be provided within the opening 36.

Figure 10:
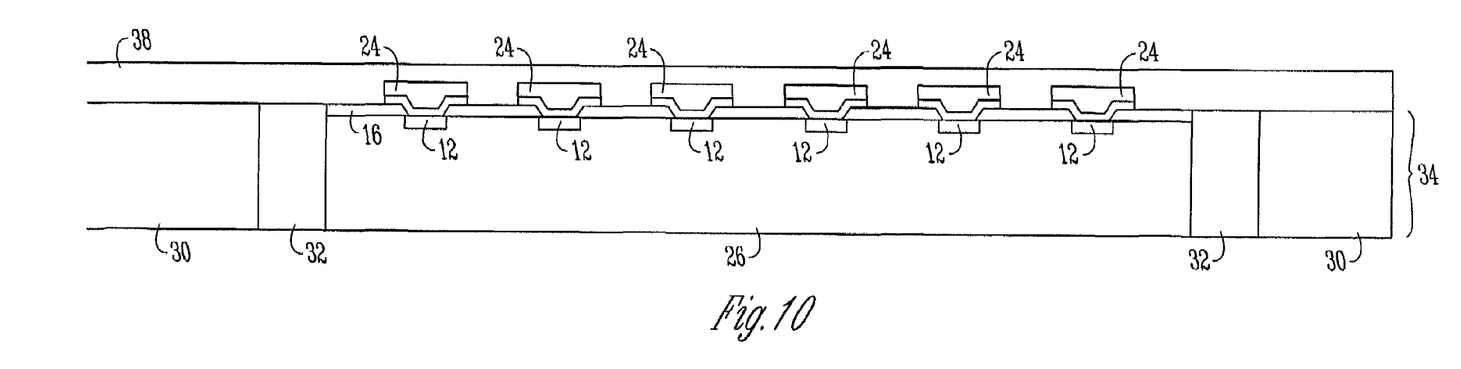
Figure 11:
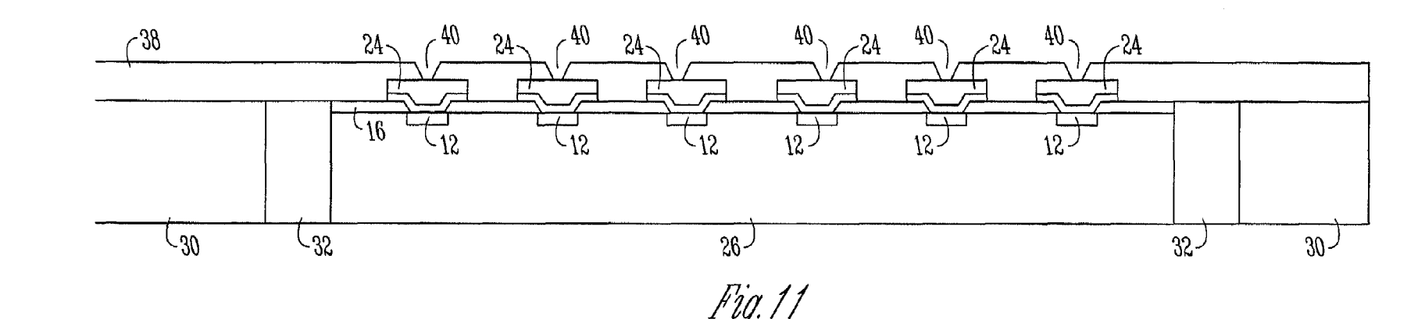

With reference to FIG. 10, a layer of dielectric material 38 is next deposited over the die core assembly 34. The dielectric layer 38 can be formed from any of a variety of different materials including, for example, glass particle filled epoxy resins (e.g., Ajinomoto Buildup Film (ABF) available from Ajinomoto), bisbenzocyclobutene (BCB) (available from Dow), polyimide, silicone rubber materials (e.g., DC6812 from DowCorning), various low-k dielectrics (e.g., SiLK from Dow Chemical), IPN (available from Ibiden), and others. After the dielectric layer 38 has been applied, a number of via holes 40 are formed through the dielectric layer 38 in locations corresponding to the expanded bond pads 24, as illustrated in FIG. 11. Any available method can be used to form the via holes 40 including, for example, laser techniques, photolithography techniques using wet or dry etching, use of photoimagable dielectric materials, and others. Because the expanded bond pads 24 have been made relatively wide, the alignment budget for the via holes 40 is substantially larger than it would have been if the via holes 40 were required to align with the smaller bond pad openings 18 in the passivation layer 16. In fact, in many cases the minimum via size may be larger than the desired size of the bond pad opening 18, requiring an unlanded via that increases the complexity of the via formation and filling process. When laser ablation is being used to form the via openings, it will typically be simpler to land the via (i.e., stop drilling) on the expanded bond pad rather than on the bond pad or on multiple different materials (i.e., the bond pad and the passivation as would be the case in an unlanded via). Significantly, if at this stage in the build up process a shift is made from package-by-package alignment to gang alignment of multiple packages within a panel, there will be an added constraint to the alignment budget resulting from die-to-die misalignment among the packages. The largest possible expansion of the bond pads will reduce this constraint as much as possible. In addition, because the expanded bond pads 24 are raised above the passivation layer 16, the expanded bond pads 24 make the surface of the die 26 appear much more like the topography typically encountered during the package build up process (i.e., more like the topography of the build up layers themselves). The material of the expanded bond pads 24 can also be made more compatible with the material of the build up layers. In one embodiment, for example, both the expanded bond pads 24 and the metallization of the build up layers are formed from copper.

Figure 12:
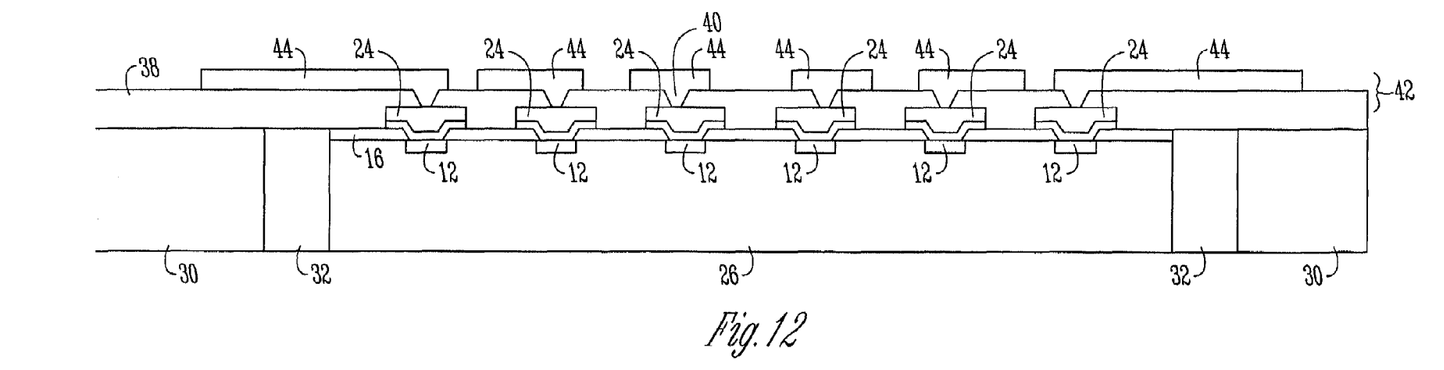
Figure 13:
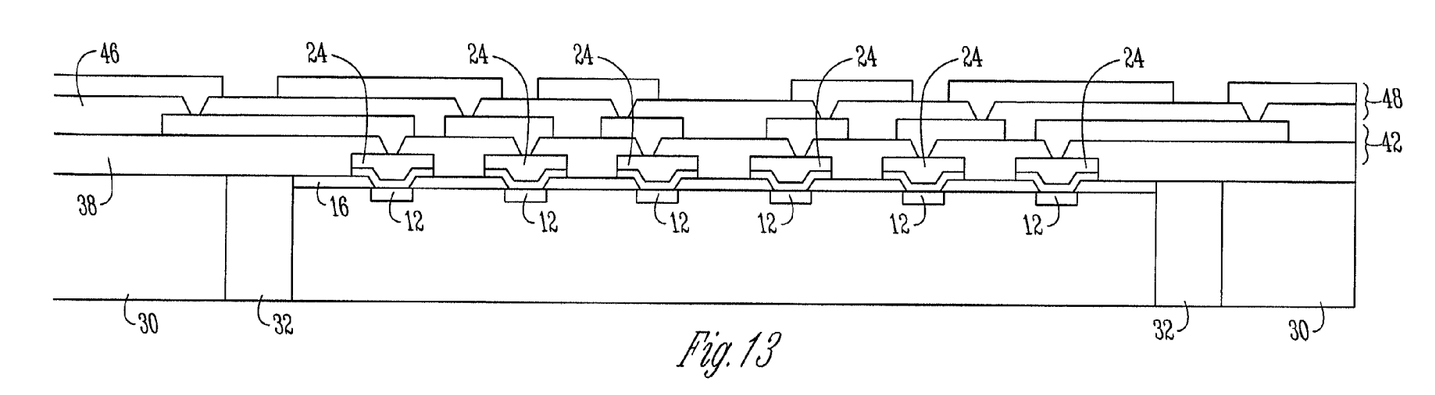

After the via holes 40 have been formed a first build up metallization layer 42 is deposited over the dielectric layer 38, as illustrated in FIG. 12. As shown, the first build up metallization layer 42 includes a number of conductive elements 44 that are each conductively coupled to an associated expanded bond pad 24 through a corresponding via hole 40. The first buildup metallization layer 42 (and the other build up layers, if any) may be formed by any known technique, including but not limited to semi-additive plating and photo lithographic techniques. An exemplary semi-additive plating technique can involve depositing a seed layer, such as a sputter-deposited or electroless-deposited metal, on the dielectric layer 38. A resist layer is then patterned on the seed layer followed by electrolytic plating of a layer of metal, such a copper, on the seed layer exposed by open areas in the patterned resist layer. The patterned resist layer is stripped and portions of the seed layer not having the layer of metal plated thereon are etched away. Other methods of forming conductive elements 44 will be apparent to those skilled in the art. Another dielectric layer 46 and a second build up metallization layer 48 may then be deposited, as illustrated in FIG. 13. Additional build up layers can also be applied. Eventually, a number of external package contacts or leads are formed to provide an interface to an external circuit.

Figure 14:
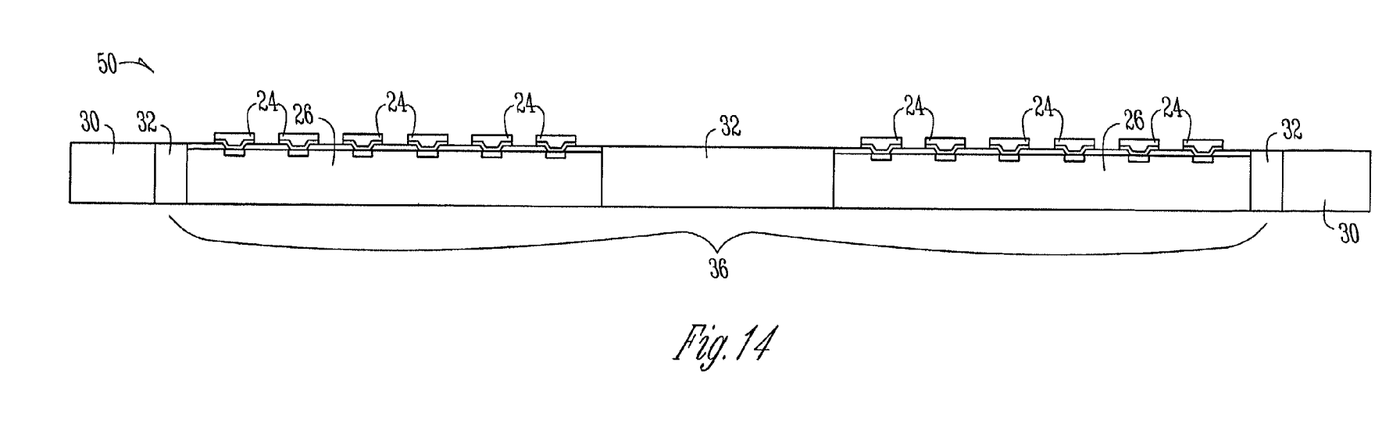
FIG. 14 is a simplified cross sectional side view of a multiple chip die core assembly in accordance with one embodiment of the present invention.
Figure 15:
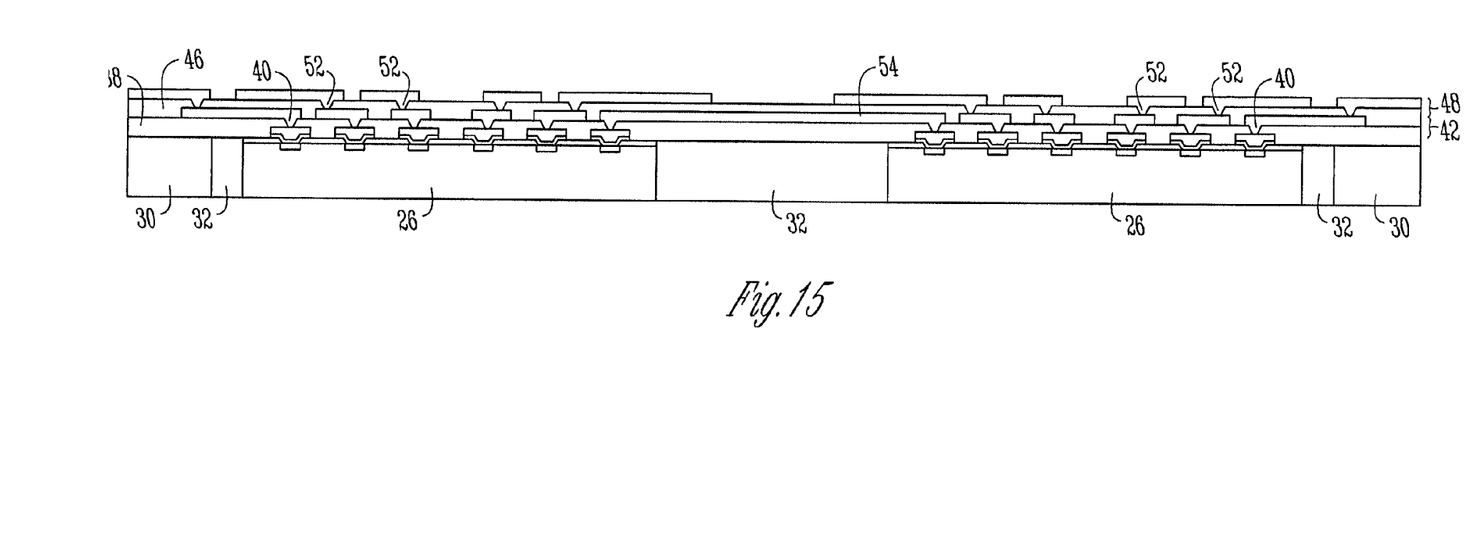
FIG. 15 is a simplified cross sectional side view of the multiple chip die core assembly of FIG. 14 after a pair of build up metallization layers have been deposited.

As described previously, in at least one embodiment, the principles of the present invention are used to fabricate a multi-chip module (MCM). FIG. 14 is a simplified cross sectional side view of a multiple chip die/core assembly 50 that can be used to form an MCM in accordance with one embodiment of the present invention. As shown, multiple dice 26, each having expanded pads 24 disposed thereon, are fixed within an opening 36 in a package core 30. In an alternative embodiment, the dice 26 are each fixed within a separate opening in the package core 30. More precise chip alignment may be required to align the dice 26 to one another before the encapsulation material 32 is added and allowed to harden. After the multiple chip die/core assembly 50 has been formed, the build up process can proceed substantially as described above. For example, with reference to FIG. 15, a first dielectric layer 38 can be deposited and via holes 40 formed therethrough. A first build up layer 42 can then be applied over the first dielectric layer 38. Similarly, a second dielectric layer 46 can be deposited over the first build up layer 42 and via holes 52 can be formed therein. A second build up layer 48 can be deposited on the second dielectric layer 46. Significantly, the build up layers 42, 48 can be used to provide inter-chip communication between the dice 26 of the module. For example, as shown in FIG. 15, one or more traces 54 can be provided on the first build up layer 42 to provide communication between a bond pad 12 (or multiple bond pads 12) within one die and a bond pad 12 (or multiple bond pads 12) within another die.

In addition to the above, the inventive principles can also be used to fabricate multiple microelectronic devices on a single panel that is then cut up into individual packaged devices. The packaged devices can be either single-chip or multi-chip devices. A number of dice that each have expanded bond pads thereon are first fixed within corresponding openings in a panel. The panel forms the package core for each of the devices being fabricated. One or more build up metallization layers are then formed over the panel. The panel is then divided into multiple independent microelectronic devices.

Figure 16:
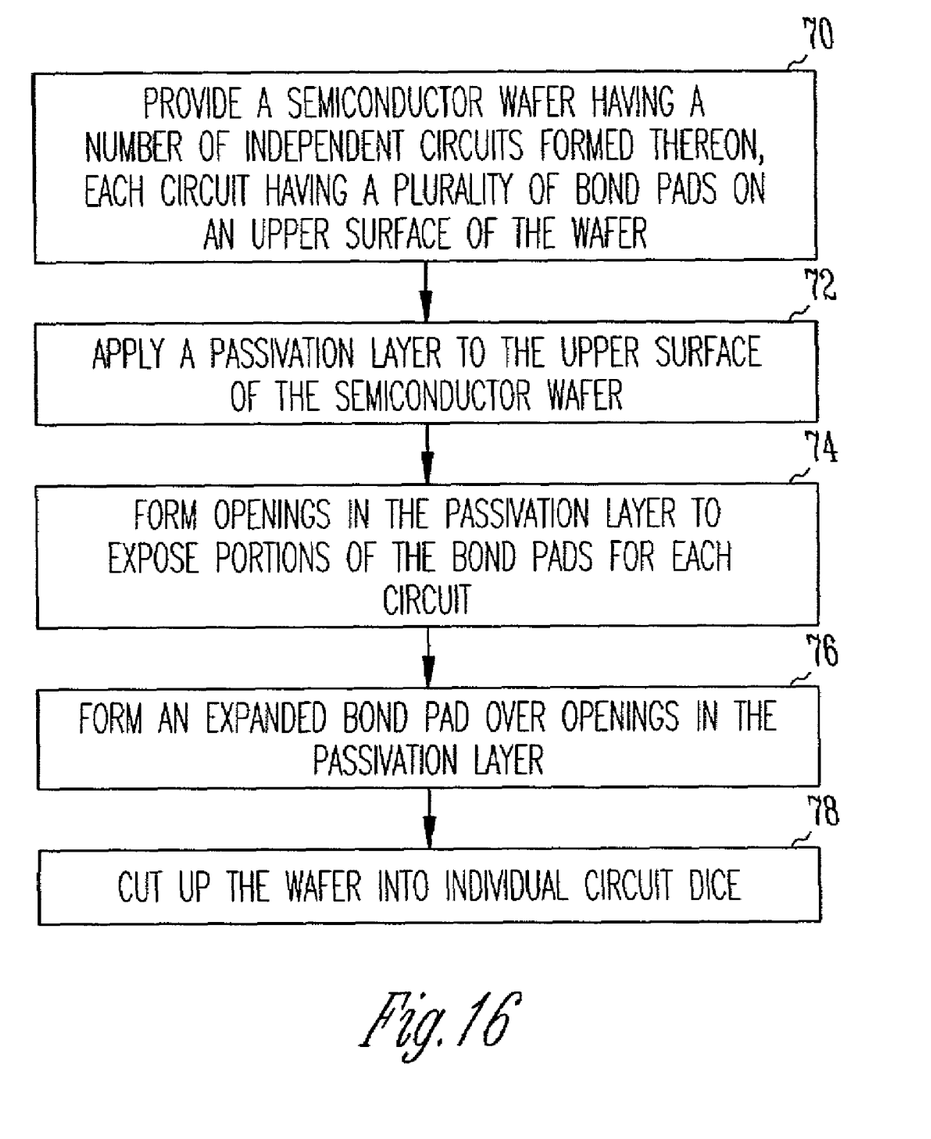
FIG. 16 is a flow chart illustrating a process for manufacturing a microelectronic die in accordance with one embodiment of the present invention.

FIG. 16 is a flow chart illustrating a process for manufacturing a microelectronic die in accordance with one embodiment of the present invention. A semiconductor wafer is first provided that includes a number of independent circuits distributed across an upper surface thereof (block 70). Each circuit has a number of bond pads on an upper surface of the wafer. Methods for preparing such wafers are well known in the art and, therefore, will not be described further herein. Typically, each of the independent circuits on the wafer will be identical with the others. Any of a wide range of different circuit types can be formed (e.g., digital processing devices, logic circuits, etc.). A passivation layer is next deposited on the upper surface of the wafer (block 72). Openings are then formed though the passivation layer to expose portions of the bond pads for each of the circuits (block 74). Expanded bond pads are then formed over some or all of the openings in the passivation layer which are then conductively coupled to the independent circuits below the passivation layer (block 76). An adhesion layer and/or a seed layer may be applied over the passivation layer as part of the expanded pad formation to enhance metal adhesion to the passivation material. The wafer is then cut up into individual circuit dice to await packaging (block 78). The individual dice may be electrically tested before the wafer is cut.

Figure 17:
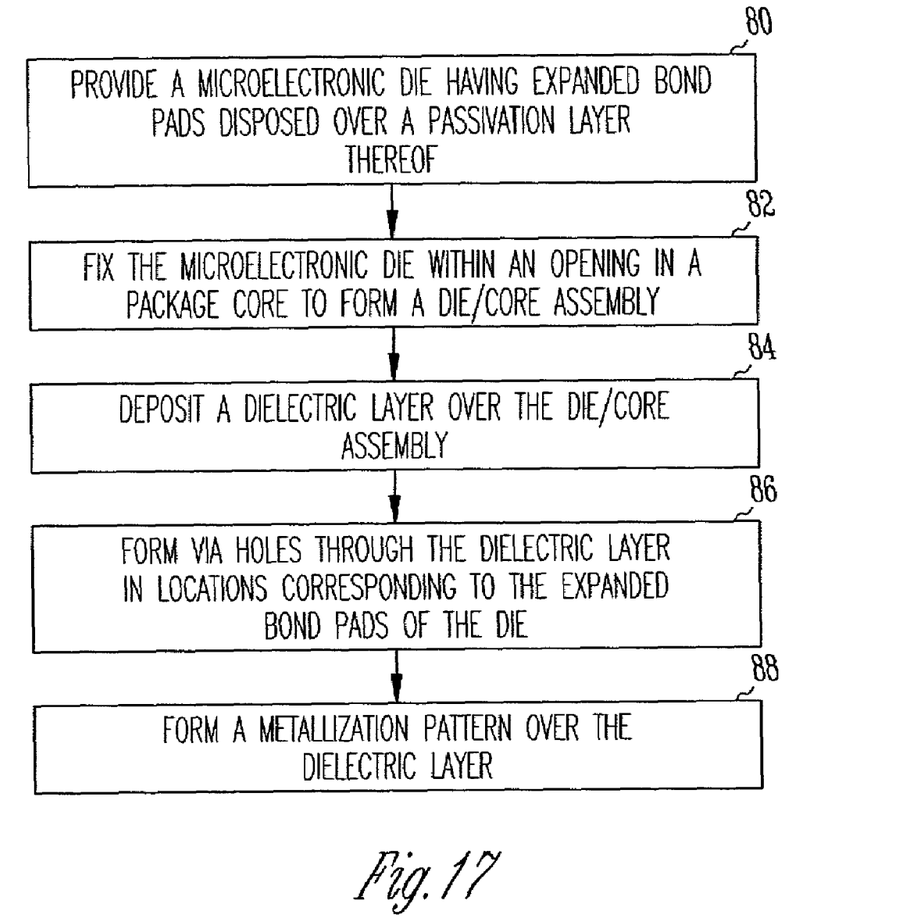
FIG. 17 is a flow chart illustrating a process for packaging a microelectronic die in accordance with one embodiment of the present invention.

FIG. 17 is a flow chart illustrating a method for packaging a microelectronic die in accordance with one embodiment of the present invention. A microelectronic die is provided that has expanded bond pads disposed over openings in a passivation layer thereof (block 80). Each of the expanded bond pads is conductively coupled to one or more associated bond pads of the die through corresponding openings in the passivation layer. The expanded bond pads each have dimensions that are larger than those of the associated bond pad openings in the passivation layer. The microelectronic die with the expanded bond pads is then fixed within an opening in a package core to form a die/core assembly (block 82). A layer of dielectric material is then deposited over the die/core assembly (block 84) and via holes are formed in the dielectric layer in locations corresponding to the expanded bond pads (block 86) and potentially in other locations. A metallization pattern is then formed on the dielectric layer (block 88) that is conductively coupled to the expanded bond pads through the corresponding via holes. Further dielectric layers and metallization patterns can also be applied.

Although FIGS. 1–15 illustrate various views and embodiments of the present invention, these figures are not meant to portray microelectronic assemblies in precise detail. For example, these figures are not typically to scale. Rather, these figures illustrate microelectronic assemblies in a manner that is believed to more clearly convey the concepts of the present invention. In addition, it should be appreciated that the present invention does not require a one to one correspondence between expanded pads and bond pads. For example, expanded pads may be provided for only a subset of the bond pads of the die or a single bond pad may cover multiple bond pad openings.

Although the present invention has been described in conjunction with certain embodiments, it is to be understood that modifications and variations may be resorted to without departing from the spirit and scope of the invention as those skilled in the art readily understand. For example, it should be understood that various additional acts can be performed (e.g., intermediate cleaning and/or surface roughening acts) and structures created (e.g., additional adhesion layers, etc.) during device fabrication in accordance with the present invention. Such modifications and variations are considered to be within the purview and scope of the invention and the appended claims.

What is claimed is:

1. A method of fabricating a microelectronic device, comprising:
   providing a semiconductor wafer having a plurality of bond pads on an upper surface thereof, said semiconductor wafer carrying a plurality of independent circuits;
   applying a passivation layer to said upper surface of said semiconductor wafer;
   creating openings in said passivation layer to expose portions of bond pads on said upper surface of said semiconductor wafer;
   forming symmetrically expanded bond pads over selected openings in said passivation layer;
   cutting said semiconductor wafer into a plurality of individual microelectronic dice after depositing said expanded bond pads, said plurality of individual microelectronic dice including a first die;
   fixing said first die within a package core to form a die/core assembly; and
   building up at least one metallization layer over said die/core assembly.

2. The method of claim 1, wherein:
   forming symmetrically expanded bond pads includes depositing an adhesion layer over said semiconductor wafer after creating said openings to enhance adhesion of said expanded bond pads to said passivation layer.

3. The method of claim 1, wherein:
   forming symmetrically expanded bond pads includes pattern plating said bond pads above said selected openings.

4. The method of claim 1, wherein:
   forming symmetrically expanded bond pads includes patterning metallization for multiple independent circuits of said semiconductor wafer using a single mask.

5. The method of claim 1, wherein:
   forming symmetrically expanded bond pads includes forming a first expanded bond pad that is conductively coupled to multiple bond pads on said upper surface of said semiconductor wafer through corresponding openings in said passivation layer.

6. The method of claim 1, wherein:
   forming symmetrically expanded bond pads includes using a lead free controlled collapse chip connect (C4) deposition process to fashion said expanded bond pads on said semiconductor wafer.

7. The method of claim 1, wherein:
   said symmetrically expanded bond pads are composed predominantly of copper.

8. The method of claim 1, wherein:
   said symmetrically expanded bond pads each have at least one dimension in a plane of said passivation layer that is greater than a corresponding dimension of an associated bond pad opening on said upper surface of said semiconductor wafer.

9. The method of claim 8, wherein:
   said symmetrically expanded bond pads each have dimensions in two orthogonal directions within said plane of said passivation layer that are greater than corresponding dimensions of an associated bond pad opening on said upper surface of said semiconductor wafer.

10. The method of claim 1, wherein:
fixing said first die within a package core includes holding said die within an opening in said package core, introducing an encapsulation material into said opening, and allowing said encapsulation material to cure.

11. The method of claim 1, wherein:
building up at least one metallization layer over said die/core assembly includes depositing a dielectric layer over said die/core assembly, forming via holes through said dielectric layer to expose portions of said symmetrically expanded bond pads, and depositing a first metallization layer on said dielectric layer, said first metallization layer contacting said exposed portions of said expanded bond pads through said via holes.

12. A method of fabricating a microelectronic device, comprising:
providing a semiconductor wafer having a plurality of bond pads on an upper surface thereof, said semiconductor wafer carrying a plurality of independent circuits;
applying a passivation layer to said upper surface of said semiconductor wafer;
creating openings in said passivation layer to expose portions of bond pads on said upper surface of said semiconductor wafer;
forming symmetrically expanded bond pads over selected openings in said passivation layer, wherein forming expanded bond pads includes depositing an adhesion layer over said semiconductor wafer after creating said openings to enhance adhesion of said expanded bond pads to said passivation layer, and wherein forming expanded bond pads includes depositing a seed layer over said semiconductor wafer, after depositing said adhesion layer, to facilitate deposition of said expanded bond pads;
cutting said semiconductor wafer into a plurality of individual microelectronic dice after depositing said expanded bond pads, said plurality of individual microelectronic dice including a first die;
fixing said first die within a package core to form a die/core assembly; and
building up at least one metallization layer over said die/core assembly.

13. A method for fabricating a microelectronic device comprising:
providing a first microelectronic die having first symmetrically expanded bond pads disposed over selected openings in a passivation layer thereof, each of said first symmetrically expanded bond pads being conductively coupled to at least one associated bond pad of said first microelectronic die through one or more corresponding openings in said passivation layer of said first microelectronic die;
providing a second microelectronic die having second symmetrically expanded bond pads disposed over a passivation layer thereof, each of said second symmetrically expanded bond pads being conductively coupled to at least one associated bond pad of said second microelectronic die through one or more corresponding openings in said passivation layer of said second microelectronic die;
fixing said first microelectronic die and said second microelectronic die within a package core to form a die/core assembly;
depositing a dielectric layer over said die/core assembly;
forming via holes through said dielectric layer to expose portions of said first and second symmetrically expanded bond pads; and
depositing a metallization layer on said dielectric layer, said metallization layer contacting said exposed portions of said first and second symmetrically expanded bond pads through said via holes.

14. The method of claim 13, wherein providing a first microelectronic die includes:
providing a first semiconductor wafer having a plurality of bond pads on an upper surface thereof, said first semiconductor wafer carrying a plurality of independent circuits;
applying a passivation layer to said upper surface of said first semiconductor wafer;
creating openings in said passivation layer to expose portions of bond pads on said upper surface of said first semiconductor wafer;
forming symmetrically expanded bond pads over said passivation layer; and
cutting said first semiconductor wafer into a plurality of individual microelectronic dice after depositing said symmetrically expanded bond pads, said plurality of individual microelectronic dice including said first microelectronic die.

15. The method of claim 13, wherein
fixing said first microelectronic die and said second microelectronic die within a package core includes fixing said first and second microelectronic dice within a common opening in said package core.

16. The method of claim 13, wherein
fixing said first microelectronic die and said second microelectronic die within a package core includes fixing said first microelectronic die within a first opening in said package core and fixing said second microelectronic die within a second opening in said package core.

17. The method of claim 13, wherein
fixing said first microelectronic die and said second microelectronic die within a package core includes fixing said first and second microelectronic dice within said package core using an encapsulation material.

18. The method of claim 13, wherein
depositing a metallization layer includes patterning said metallization layer on said dielectric layer using a single mask.

19. The method of claim 13, wherein
depositing a metallization layer includes forming a first conductive element on said dielectric layer that provides conductive communication between a first symmetrically expanded bond pad on said first microelectronic die and a second symmetrically expanded bond pad on said second microelectronic die.

20. The method of claim 13, comprising:
dividing said package core into multiple portions, after depositing said metallization layer, to produce multiple independent microelectronic devices, one of said multiple independent microelectronic devices including said first microelectronic die and another of said multiple independent microelectronic devices including said second microelectronic die.

21. A method of fabricating a microelectronic device, comprising:
providing a semiconductor wafer having a plurality of bond pads on an upper surface thereof, said semiconductor wafer carrying a plurality of independent circuits;

applying a passivation layer to said upper surface of said semiconductor wafer;

creating openings in said passivation layer to expose portions of bond pads on said upper surface of said semiconductor wafer;

depositing a conductive adhesion layer on said passivation layer;

forming a masking layer on said semiconductor wafer over said adhesion layer;

plating said semiconductor wafer in regions defined by said masking layer to form symmetrically expanded bond pads over selected openings in said passivation layer; and cutting up said semiconductor wafer into a plurality of individual circuit dice.

22. The method of claim 21, comprising:

fixing a die from said plurality of individual dice within a package core to form a die/core assembly; and building up at least one metallization layer over said die/core assembly.

23. The method of claim 21, wherein:

depositing a conductive adhesion layer includes sputter depositing a layer of copper on said passivation layer.

24. The method of claim 21, wherein:

depositing a conductive adhesion layer includes sputter depositing at least one of the following materials on said passivation layer: titanium, chromium, tungsten, tantalum, and tantalum nitride.

25. The method of claim 21, wherein:

plating said semiconductor wafer includes electroplating said semiconductor wafer with copper.

26. The method of claim 21, wherein:

plating said semiconductor wafer includes using a lead free controlled collapse chip connect (C4) deposition process.

27. The method of claim 21, further comprising:

depositing a conductive seed layer on said conductive adhesion layer before forming said mask.

* * * * *